(12) United States Patent
Svidenko et al.

(10) Patent No.: US 7,956,337 B2
(45) Date of Patent: Jun. 7, 2011

(54) SCRIBE PROCESS MONITORING METHODOLOGY

(75) Inventors: Vicky Svidenko, Sunnyvale, CA (US); Tzay-Fa (Jeff) Su, San Jose, CA (US); Chuck Luu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 298 days.

(21) Appl. No.: 12/207,403

(22) Filed: Sep. 9, 2008

(65) Prior Publication Data
US 2010/0059693 A1 Mar. 11, 2010

(51) Int. Cl.
*H01J 49/00* (2006.01)
*A61N 5/00* (2006.01)

(52) U.S. Cl. ............. 250/492.22; 250/492.1; 250/492.2; 136/244; 136/256; 219/121.72

(58) Field of Classification Search ............... 250/492.1, 250/492.2, 492.22; 136/244, 256; 219/121.72; 702/80, 81; 29/890.033
See application file for complete search history.

(56) References Cited

U.S. PATENT DOCUMENTS

| 4,144,493 | A |   | 3/1979  | Lee et al.       |          |
|-----------|---|---|---------|------------------|----------|
| 4,892,592 | A |   | 1/1990  | Dickson et al.   |          |
| 5,593,901 | A | * | 1/1997  | Oswald et al.    | 438/80   |
| 5,607,601 | A | * | 3/1997  | Loper et al.     | 438/708  |
| 5,956,572 | A |   | 9/1999  | Kidoguchi et al. |          |
| 6,077,722 | A |   | 6/2000  | Jansen et al.    |          |
| 6,281,696 | B1|   | 8/2001  | Voogel           |          |
| 6,376,797 | B1| * | 4/2002  | Piwczyk et al.   | 219/121.72 |
| 6,515,218 | B1| * | 2/2003  | Shimizu et al.   | 136/256  |
| 6,858,461 | B2| * | 2/2005  | Oswald et al.    | 438/68   |
| 7,019,207 | B2| * | 3/2006  | Harneit et al.   | 136/244  |
| 7,166,161 | B2| * | 1/2007  | Lazarev et al.   | 117/4    |
| 7,259,321 | B2| * | 8/2007  | Oswald et al.    | 136/244  |
| 2003/0121542 | A1| * | 7/2003 | Harneit et al.  | 136/244  |
| 2008/0202576 | A1| * | 8/2008 | Hieslmair       | 136/244  |
| 2009/0077805 | A1| * | 3/2009 | Bachrach et al. | 29/890.033 |
| 2009/0104342 | A1| * | 4/2009 | Wang et al.     | 427/8    |
| 2009/0145472 | A1| * | 6/2009 | Li              | 136/244  |
| 2009/0179651 | A1| * | 7/2009 | Elgar et al.    | 324/501  |
| 2009/0281753 | A1| * | 11/2009| Noy             | 702/81   |
| 2010/0216295 | A1| * | 8/2010 | Usenko          | 438/470  |

FOREIGN PATENT DOCUMENTS
WO   WO 03 061013   7/2003
* cited by examiner

*Primary Examiner* — David A Vanore
(74) *Attorney, Agent, or Firm* — Patterson & Sheridan, L.L.P.

(57) ABSTRACT

One embodiment of the present invention sets forth a computer-implemented method for tuning laser scribe parameters during the fabrication of a solar module. The method includes analyzing the visual appearance of a laser scribe to extract various morphological parameters related to the quality of a laser scribe process used to produce the scribe. Based on the morphological parameters, the laser scribe parameters may be modified in-situ to achieve settings that are optimal for performing laser scribing in each layer of the solar module. As a result, laser scribe process cycle time may be minimized while providing better indication of the laser scribe process stability and quality relative to the prior art approaches.

24 Claims, 5 Drawing Sheets

SCRIBE PROCESS MONITORING METHODOLOGY

BACKGROUND OF THE INVENTION

1. Field of the Invention

Embodiments of the present invention relate generally to photovoltaic devices and, more specifically, to a method of controlling the process parameters during a scribing process.

2. Description of the Related Art

As photovoltaic industry matures, there is a growing need for increased process control in the production of solar cells. Tighter process control can improve yield and allow scaling of current fabrication processes to larger substrates. To cost effectively and efficiently form multiple solar cell devices (referred to herein as "solar modules"), various solar cell formation process parameters throughout the fabrication process need to be effectively controlled. One set of such parameters is related to a scribing process, such as a laser scribe process, performed at various stages of solar module fabrication process.

The three major parameters used to control a laser scribe process are laser scan speed, frequency of the laser, and output current of the laser. The laser scan speed is dictated by manufacturing throughput requirements and is typically set at some constant value. The frequency and the output current of the laser govern the actual power produced by the laser. When performing laser scribing in various stages of the solar module fabrication, if the laser power is too low, the laser does not generate enough heat to cut through, or ablate, a respective layer. If, however, the laser power is too high, the laser cuts not only through the respective layer but may also cut or damage the layer(s) or substrate disposed underneath. Therefore, tuning the laser scribe parameters to achieve the laser power necessary to make a clean cut through a specific layer of the solar module is important.

One approach to optimizing the laser scribe parameters includes making a laser scribe to produce a trench in a specific layer of a solar module, taking the unfinished solar module out of the laser scribing chamber, using a profilometer to determine the dimensions of the trench and the roughness of the bottom of the trench, adjusting the laser scribe parameters to improve subsequent laser scribes, and then placing the solar module back into the laser scribing chamber or discarding the processed substrate. Drawbacks of using such an off-line measurement technique can include an increased laser scribe cycle time and cost of producing a solar cell.

Another approach to optimizing the scribing process parameters includes performing direct measurements (e.g., resistance measurements) using standard test equipment on a finished solar module. However, measurement limitations hinder the ability to obtain granular visibility into the laser scribe process and perform efficient process control. In addition, since the information provided by such measurements is often limited to the performance of finished solar modules, thus determining the root cause of poorly performing solar cell modules and fully understanding and characterizing a formed solar module may be challenging.

As the foregoing illustrates, what is needed in the art is a technique for monitoring and tuning a scribing process that avoids the drawbacks of the prior art approaches.

SUMMARY OF THE INVENTION

One embodiment of the present invention sets forth a method for in-situ tuning of a scribe process performed on a substrate placed in a process chamber and having a first layer disposed thereon, the method comprising performing a first scribe on the first layer using a first set of scribe parameters, analyzing at least a portion of the first scribe to identify one or more morphological parameters, wherein the one or more morphological parameters are dependent on the first set of scribe parameters, based on the at least one morphological parameter, modifying the first set of scribe parameters to obtain a second set of scribe parameters, and performing a second scribe on the first layer using the second set of scribe parameters.

Embodiments of the invention may further provide a computer-readable storage medium storing a computer program which, when executed by a processor, performs operations for in-situ tuning of a scribe process performed on a substrate placed in a process chamber and having a first layer disposed thereon, the operations comprising instructing a scribe module to perform a first scribe on the first layer using a first set of scribe parameters, analyzing at least a portion of the first scribe to identify one or more morphological parameters, wherein the one or more morphological parameters are dependent on the first set of scribe parameters, based on the at least one morphological parameter, modifying the first set of scribe parameters to obtain a second set of scribe parameters, and instructing a scribe module to perform a second scribe on the first layer using the second set of scribe parameters.

Embodiments of the invention may further provide a method of patterning a solar cell device, comprising placing a first substrate having a first layer disposed thereon into a process chamber, removing a first region of the first layer using a scribing device, forming an image using a camera that is positioned to view at least a portion of the first region, analyzing the image using a controller to define one attribute of the at least a portion of the first region, and adjusting at least one scribing device parameter using information received from analyzing the image.

Embodiments of the invention may further provide a system for forming a pattern on a solar cell device, comprising a scribing device that is adapted to remove a region of a material disposed on a substrate surface, a optical inspection device positioned to create an image of the region of the material removed from the substrate surface, an automation device used to control the position of the substrate relative to the scribing device, and a controller that is in communication with the scribing device and the optical inspection device, wherein the controller is adapted to adjust one or more of the process variables that are used to vary the amount of the material removed in the region based on the image received from the optical inspection device.

One advantage of the disclosed method is that the method enables a simple and straightforward analysis to determine the laser scribe process quality and stability and to tune the laser scribe process in-situ (i.e., no off-line measurements). Eliminating the need to perform off-line measurements allows keeping solar modules in the production line, thereby shortening laser scribe cycle time and decreasing production costs. Furthermore, the method allows finding defects in the laser scribes that cannot be measurable by current Quality Assurance methods.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention contemplate a method and an apparatus used to analyze and control a scribing process performed during the formation of a solar cell device. It is also contemplated that data collected from the analysis of the scribing process can be used to tune and or improve the process results for the current and subsequent solar cell devices that are fabricated in a solar cell production line. In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Solar Module Overview

Figure 1A:
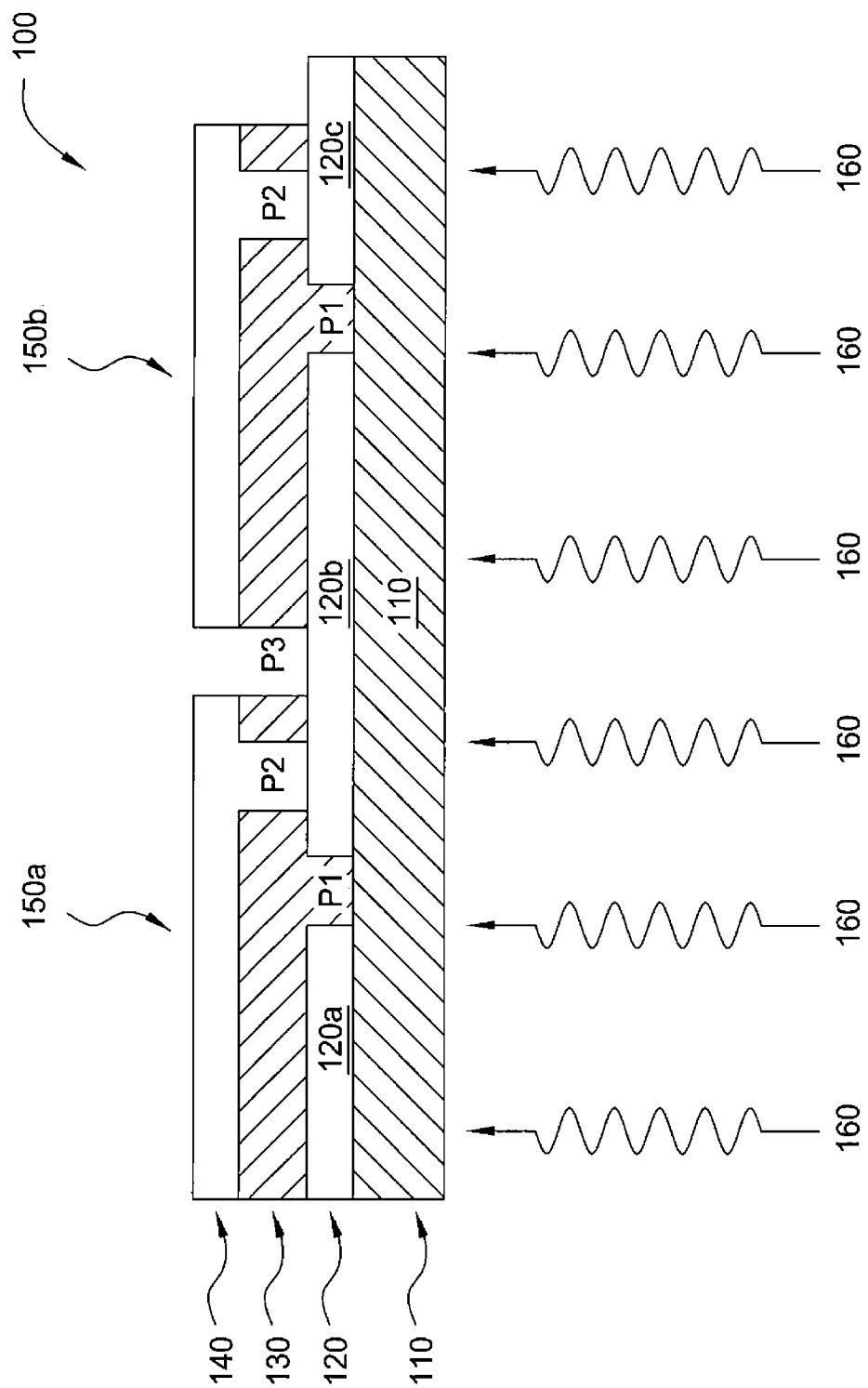
FIG. 1A is a schematic cross-section of a solar module illustrating various laser scribes, according to one embodiment of the present invention.

FIG. 1A is a schematic cross-section of a solar module 100 illustrating various laser scribes, according to one embodiment of the present invention. As shown, the solar module 100 includes a transparent substrate 110 (e.g., glass), a front contact layer 120 disposed over the substrate 110, a photovoltaic (PV) layer 130 disposed over the front contact layer 120, and a back contact layer 140 disposed over the PV layer 130. The front contact layer 120 may be any optically transparent and electrically conductive film, such as PVD-deposited ZnO adapted to serve as a front electrode for solar cells 150a and 150b. The PV layer may be a silicon film that includes one or more p-i-n junctions, which convert the energy from incident photons 160 to electricity through the PV effect. Several types of silicon films may be used to form the p-type, intrinsic type, and n-type layers of the PV layer 130, such as microcrystalline silicon, amorphous silicon, polycrystalline silicon, and the like. The back contact layer 140 may include one or more conductive layers adapted to serve as a back electrode for the solar cells 150a and 150b, such as PVD-deposited zinc (Zn), tin (Sn), aluminum (Al), copper (Cu), silver (Ag), nickel (Ni), vanadium (V), zinc oxide (ZnO), or nickel vanadium alloy (NiV), among others.

Three laser scribing steps may be performed to produce trenches P1, P2, and P3, which are required to form a high efficiency solar cell device, such as solar module 100. Although formed together on the substrate 110, the solar cells 150a and 150b are isolated from each other by the insulating trench P3 formed in the back contact layer 140 and the PV layer 130. In addition, the trench P2 is formed in the PV layer 130 so that the back contact layer 140 is in electrical contact with the front contact layer 120. In one embodiment, the insulating trench P1 is formed by the laser scribe removal of a portion of the front contact layer 120 prior to the deposition of the PV layer 130 and the back contact layer 140. Similarly, in one embodiment, the trench P2 is formed in the PV layer 130 by the laser scribe removal of a portion of the PV layer 130 prior to the deposition of the back contact layer 140. In one embodiment, the trench P2 may be a single relatively large trench or area, as shown, to provide ample contact area between the front contact layer 120 and the back contact layer 140. In other embodiments, the trench P2 may be formed by a plurality of small grooves. Finally, the insulating trench P3 is formed by the laser scribe removal of portions of the back contact layer 140 and the PV layer 130.

Since each of the trenches P1, P2, and P3 have a different role, each scribing step performed to produce these trenches has different process requirements. As previously described, when using a laser scribe process the laser scan speed, the frequency of the laser, and output current of the laser can be used to control the laser scribe process, where the latter two parameters are used to control the delivered laser power. Different laser power settings result in different visual appearances of the scribe. It should be noted that frequency of the laser, as discussed herein, is defined as the frequency with which pulses of energy are delivered to the surface of the substrate. As described in relation to FIGS. 2-4, by performing a visual analysis of the laser scribe image, various parameters (referred to herein as "morphological parameters") may be extracted in order to characterize the laser scribe process quality. Based on the morphological parameters, the laser scribe parameters may be modified in-situ to set up the optimal laser power for reliably producing scribes in each layer of the solar module 100. In this fashion, embodiments of the present invention enable shortening process cycle time by eliminating the need for off-line measurements while providing better indication of the scribe process stability and quality relative to the prior art approaches. The approaches described herein can be used to control the scribe process results to assure that the cost-of-ownership is reduced by reducing material scrap and improving device yield.

System Overview

Figure 1B:
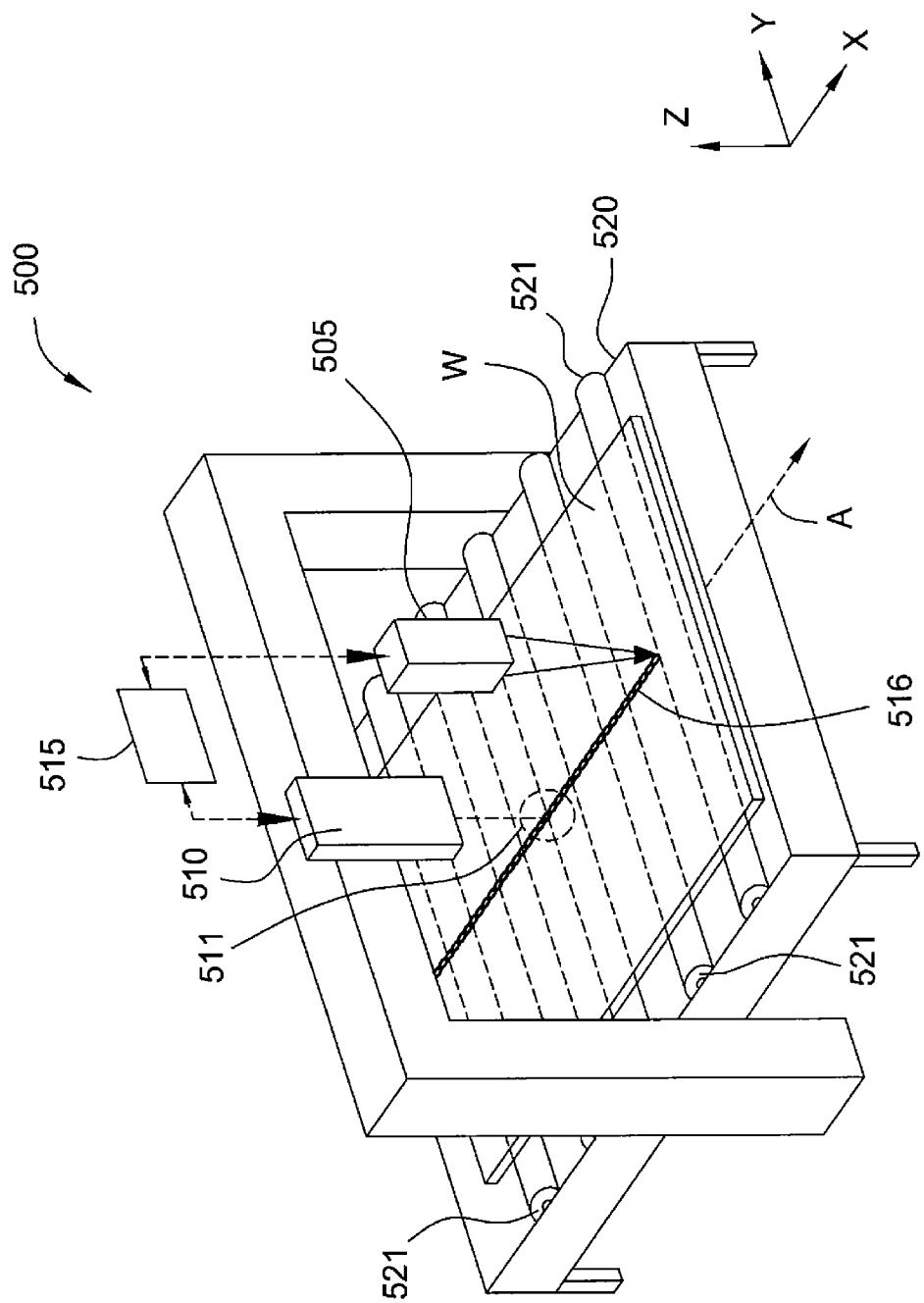
FIG. 1B is an isometric view that schematically illustrates some of the major elements of a laser scribing process module, according to one embodiment of the present invention.

FIG. 1B is an isometric view that schematically illustrates some of the major elements of a laser scribe module 500 according to one embodiment of the present invention. The laser scribe module 500 may be useful to perform the processes discussed herein. As shown, the laser scribe module 500 includes an energy transmitting device 505 and an optical inspection device 510, which are both in communication with a system controller 515. The energy transmitting device 505, or laser scribing device, generally contains an energy source (e.g., laser), various optics and other support components that are used to control the power, energy and timing of the delivery of energy used to "scribe" (e.g., scribed region 516 illustrated in FIG. 1B which could be any of the trenches P1, P2, or P3 illustrated in FIG. 1A) one or more layers disposed on the surface of a substrate "W" (e.g., the substrate 110 illustrated in FIG. 1A). The optical inspection device 510 generally contains a camera and other supporting components that are used to optically inspect various regions of the substrate including various portions of the scribed region 516. The optical inspection device 510 is generally positioned to view a region 511 of the substrate W during one or more steps of the scribing process.

The system controller 515 is adapted to control the various components in the laser scribe module 500. The system controller 515 is generally designed to facilitate the control and automation of the overall laser scribe module 500 and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., sensors, automation components, motors, laser, optical inspection device, etc.) and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 515 determines which tasks are performable on a substrate W. Preferably, the program is software readable by the system controller 515 that includes code to perform tasks relating to monitoring, execution and control of the movement, support, and/or positioning of a substrate along with the various process recipe tasks and various chamber process recipe steps being performed in the laser scribe module 500.

In one embodiment, as shown in FIG. 1B, a solar module (e.g., the solar module 100) is transferred through the laser scribe module 500 following path "A" using the automation assembly 520. The automation assembly 520 may contain a conveyor that has a plurality of conventional automated conveyor rollers 521, which are used to position the solar module within a processing chamber of the laser scribe module 500 in a controlled and automated fashion. As described in greater detail in FIGS. 2-4, once the solar module is positioned within the processing chamber, the system controller 515 may instruct the energy transmitting device 505 to perform a laser scribe, thereby producing the scribed region 516. The system controller 515 may further instruct the optical inspection device 510 to monitor the region 511 of the substrate in order to generate images of the scribed region 516. After the system controller 515 receives the images of the scribed region 516 from the optical inspection device 510, the system controller 515 may perform a digitized scan of the images to determine various visual characteristics of the scribed region 516 and extract various morphological parameters indicative of the laser scribe process quality and stability. Based on the values of the morphological parameters (e.g., based on the results from the image processing of the scribed region 516), the system controller 515 may then tune laser scribe parameters in an attempt to correct the process drift, identify a misprocessed substrate, or identify a error in the laser scribe module. In this fashion, the system controller 515 and the optical inspection device 510 interact to achieve better control of the laser scribe process.

In-Situ Monitoring and Tuning of Laser Scribe Process

Figure 2:
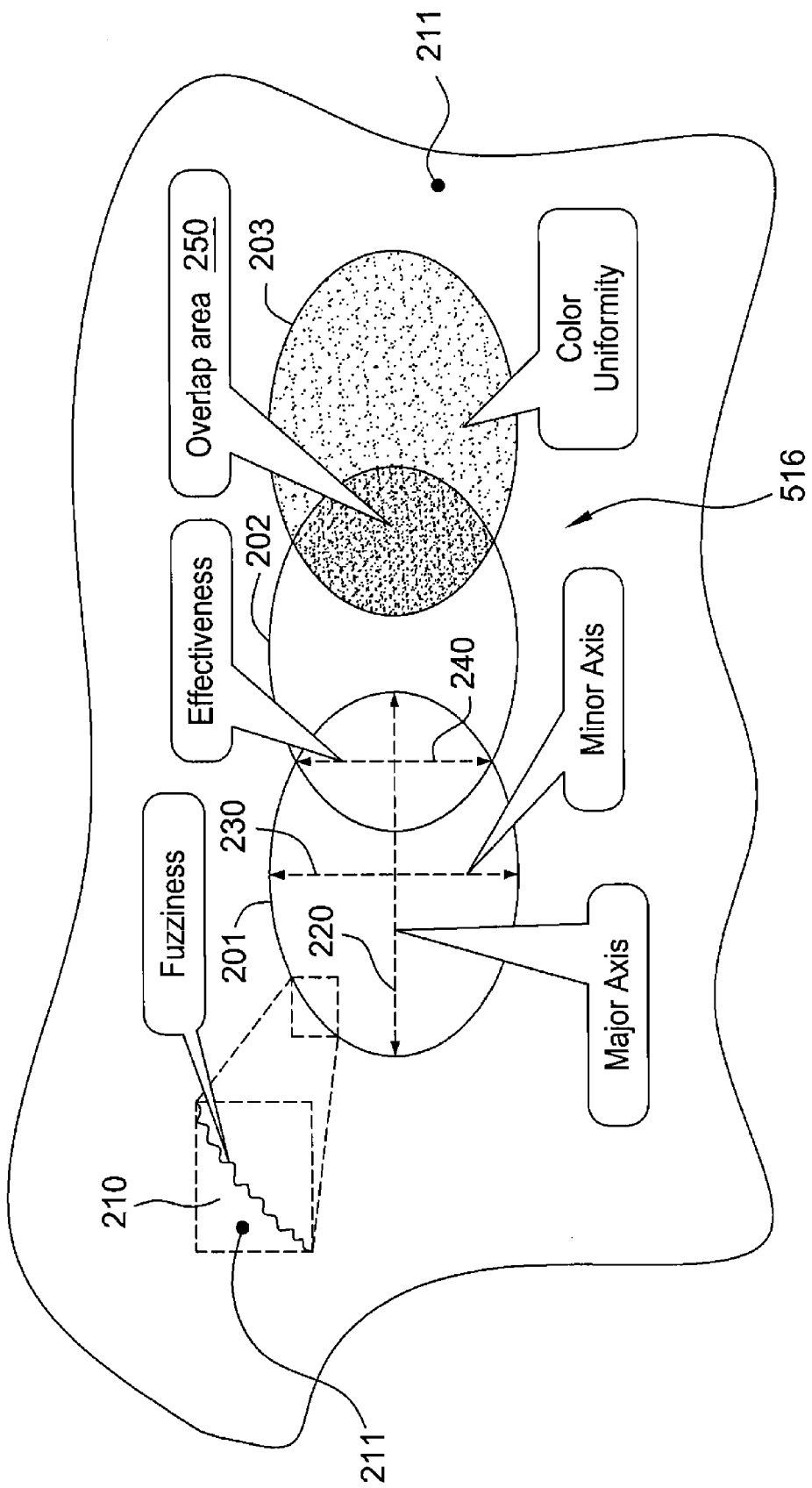
FIG. 2 illustrates various morphological parameters used to characterize a laser scribe process, according to one embodiment of the present invention.

FIG. 2 illustrates various morphological parameters used to characterize a laser scribe process, according to one embodiment of the present invention. Laser spots 201, 202, and 203, as shown in FIG. 2, schematically illustrate the visual appearance of portion of a scribed region 516 obtained using a pulsed laser with a specific frequency and a specific output current (i.e., the visual appearance of the regions of a specific layer in the solar module 100 removed by the laser scribe process). In one embodiment, the laser spots 201, 202, and 203 are formed in a layer 211 (e.g., front contact layer 120, PV layer 130, back contact layer 140) that has been formed on a surface of a substrate. The frequency of the laser set during the laser scribe process defines the distance between the centers of the laser spots 201, 202, and 203 as the substrate or laser output are moved relative to one another. The higher the frequency of the laser, the closer the centers of the laser spots 201, 202, and 203 are to one another. Conversely, the lower the frequency of the laser, the further the centers of the laser spots 201, 202, and 203 are from one another. The output current of the laser set during the laser scribe process defines the size of the laser spots 201, 202, and 203 due to the variation in the amount of material ablated during the scribing process. Generally, the larger the output current of the laser, the larger the size of the laser spots 201, 202, 203, and vice versa. It should be noted that while embodiments of the invention described herein are discussed relative to the use of a laser scribing process, or laser ablation process, this configuration is not intended to be limiting as to scope of the invention, since other controllable methods of removing material from the substrate surface could be used in conjunction with a system controller and an optical inspection device without deviating from the basic scope of the invention (e.g., water jet cutting, electron-beam bombardment, mechanical scribing).

Based on the visual analysis of the laser scribe image, morphological parameters indicative of the laser scribe process quality and stability may be extracted. In one embodiment, the controller 515 is used to analyze a digital image received by the optical inspection device 510 of a scribe formed on the substrate's surface during a scribing process. Some of the morphological parameters may be fuzziness, minor axis, major axis, eccentricity, effectiveness, overlap area, and color uniformity of the laser scribe. As illustrated in a close-up view 210 of the laser spot 201, fuzziness is a parameter that describes the sharpness of the edges of the laser scribe. Major axis and minor axis, shown in FIG. 2 with dashed lines 220 and 230, respectively, are parameters that measure the roundness of the laser spots 201, 202, and 203. In some applications, a laser scribe process is optimal when the laser spots 201, 202, and 203 are perfectly round (i.e., minor axis is equal to the major axis). In such applications, if the laser spots 201, 202, and 203 are elliptical, the laser scribe process is said to be sub-optimal because laser scribes performed in different directions with respect to the surface of the substrate would result in different overlap areas (i.e., area 250), thereby necessitating individual tuning of the laser scribe process for each direction of the laser scribe. Eccentricity is a parameter derived from the minor axis and the major axis and also describes the roundness of the laser spots 201, 202, and 203. Eccentricity may be found using the equation 1.6 shown below. Effectiveness, illustrated in FIG. 2 with a dashed line 240, which measured perpendicular to the direction of the laser scribe, is a parameter defined by the frequency and output current of the laser during a laser scribe process. Effectiveness may be determined by taking an image of the formed laser scribe and then analyzing the image to determine distances, or local minima and maxima of the scribe edge curves, in a direction transverse to the scribing direction. Overlap area, shown in FIG. 2 as area 250, is a parameter defined by the frequency and output current of the laser during a laser scribe process. In various embodiments, the overlap area should be a specific percentage of the total size of each of the laser spots 201, 202, and 203. Finally, color uniformity of the laser scribe is a parameter related to the root mean square (RMS) uniformity of the intensity and/or wavelengths of light received by the optical inspection device 510 due to reflection, transmission, and/or refraction of light by different portions of the scribed region 516.

Not all of the morphological parameters illustrated in FIG. 2 are necessary for monitoring and tuning of each laser scribe process. Since different laser scribes may have different roles in a solar module, relevant visual attributes may vary as well. For example, since trenches P1 and P3 illustrated in FIG. 1 provide isolation between the individual solar cells 150*a* and 150*b*, effectiveness, which relates to the electrical resistance across the scribed region, and possibly the minor axis information, will provide a good indication of the quality of the isolation between cells. Fuzziness calculated on the trench P3 may indicate possible shunting between layers in the solar cells 150*a* or 150*b*. Furthermore, since the trench P3 is cutting through more than one layer of the solar module 100, carefully analyzed color uniformity may help set the right laser power for optimal results.

Persons skilled in the art will recognize that conventional techniques that are commonly used to monitor the laser scribe process cannot detect the errors found by performing an automated visual analysis of the laser scribe and extracting the various morphological parameters as discussed herein. For example, inspection of fuzziness and color uniformity may reveal the melting of a metal layer onto the active layers and the TCO which results in shunting between layers within a solar cell. The inspection of color uniformity may further reveal poor removal of the material during the scribe process or damage to the substrate, since the reflection and absorption of received light is generally related to the thickness, surface properties of the remaining material, whether islands of different materials can be found within undesirable regions of the substrate surface, and the topographical shape of the features formed on the substrate surface. Also, the measurement and monitoring of the eccentricity and overlap area of portions of the scribed region can be used to better control the process results in differing directions along the surface of the substrate. Thus, using the information received from one or more of the morphological parameters the system controller can be used to better characterize, control, and/or optimized the scribing process versus other conventional analysis techniques.

Figure 3:
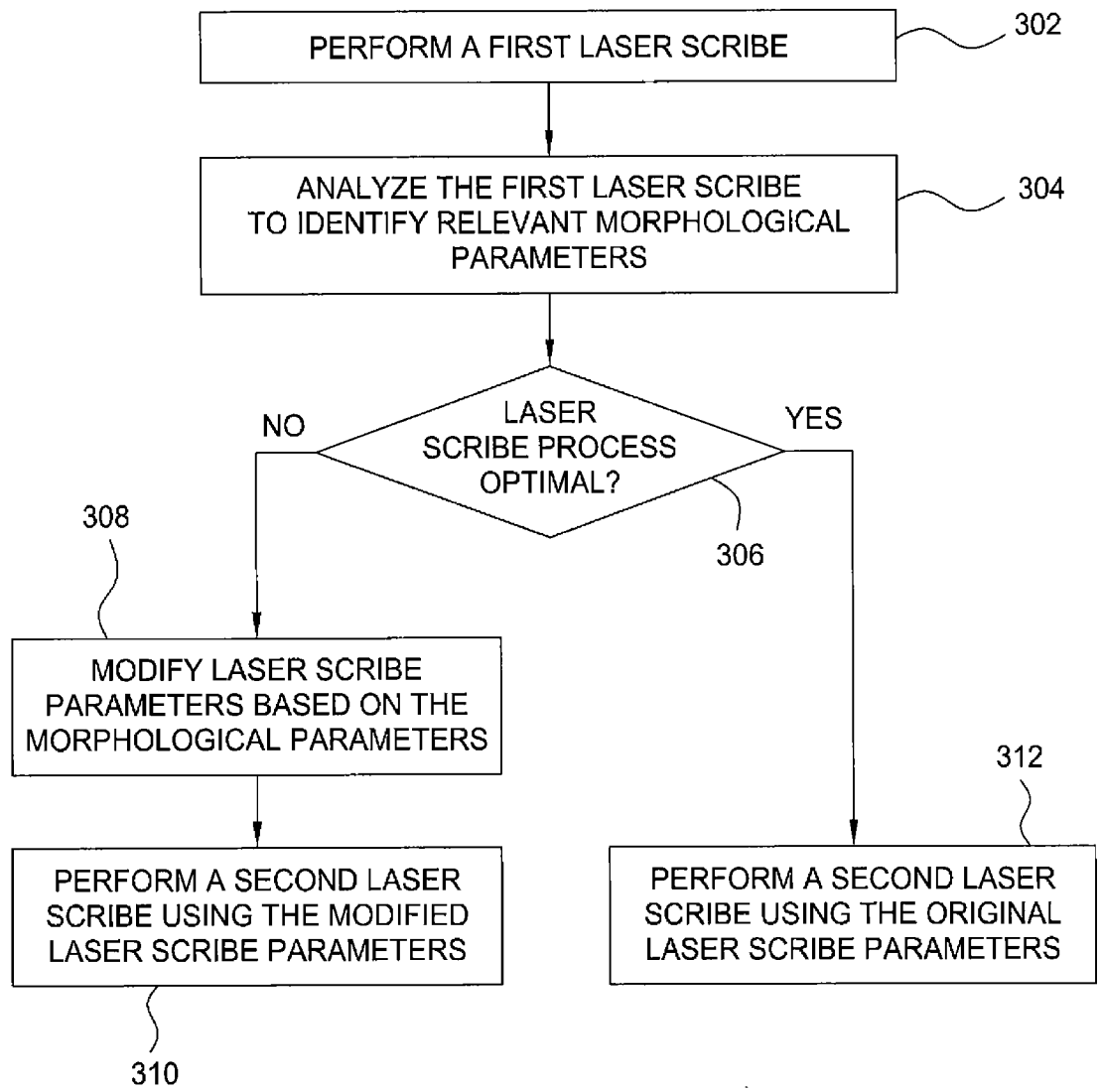
FIG. 3 is a flow diagram of method steps for in-situ tuning of laser scribe parameters during a laser scribe process, according to one embodiment of the present invention.

FIG. 3 is a flow diagram of method steps for in-situ tuning of laser scribe parameters during a laser scribe process, according to one embodiment of the present invention. While the method steps are described in conjunction with FIGS. 1A, 1B, 2, and 4, persons skilled in the art will recognize that any system configured to perform the method steps, in any order, is within the scope of the present invention.

The method begins after a substrate (e.g., the substrate 110) having a first layer disposed thereon, such as a front contact layer 120, a PV layer 130, and/or a back contact layer 140, is placed into a process chamber of a scribing module (e.g., laser scribe module 500 described in conjunction with FIG. 1B). In one embodiment, the method begins in step 302, where a controller within the laser scribe module (e.g., system controller 515 in FIG. 1B) instructs the laser scribe module to perform a first laser scribe on the first layer using a first set of laser scribe parameters. As previously described, the laser scribe parameters may define laser power and/or scan speed. For example, the laser scribe parameters may include at least one of a laser frequency, a laser output current, and a scan speed.

In one embodiment, the first set of laser scribe parameters may be based on layer parameters of the first layer, such as a substrate type, layer thickness, layer doping, or layer reflectivity. In solar modules where the first layer itself comprises a number of sub-layers referred to as a "stack," the layer parameters may also include stack information identifying the sub-layers (e.g., identifying thickness, doping, and/or reflectivity of each of the sub-layers). In other embodiments, the first set of laser scribe parameters may be based on a first laser beam power distribution.

In step 304, the controller analyzes a portion of the first laser scribe to identify relevant morphological parameters. The relevant morphological parameters may be one or more of fuzziness, minor axis, major axis, eccentricity, effectiveness, overlap area, and color uniformity, described above, that may be extracted from the visual analysis of the first laser scribe and depend on the first set of laser scribe parameters. In one embodiment, the portion of the first laser scribe may be analyzed using an optical inspection device (e.g., the optical inspection device 510 illustrated in FIG. 1B). In one embodiment, the optical inspection device may comprise a CCD camera, CMOS image sensor device, or other similar digital imaging device, having a desired digital resolution and ability to resolve color or grey scale variations in the field of view.

In step 306, the controller determines whether the identified morphological parameters indicate that the laser scribe process are optimal (i.e., whether the laser scribe process quality and stability are appropriate for a specific application). If this is not the case, the method proceeds to step 308, where, based on the identified relevant morphological parameters, the system controller modifies one or more of the first set of laser scribe parameters to obtain a second set of laser scribe parameters. Therefore, by analyzing the scribed region and measured morphological parameters the system controller can be used to automatically adjust one or more of the scribe process variables to improve the scribing process results. Examples of some of the actions that the system controller may take to correct the laser scribe process when one or more of the identified morphological parameters are out of range are discussed below.

For example, if the overlap area is determined to not be in the desired proportion of the laser spot size of the first laser scribe, the controller may be configured to modify the frequency of the laser. If the minor axis, the major axis, or the effectiveness is too small, the controller may be configured to increase the power of the laser to ensure that the local minima and maxima of the laser scribe edge are not too close together (and vice versa). If eccentricity is not equal to 1, or scribe spot is not circular, the controller may be configured to adjust the time or shape distribution of the energy delivered to the surface of the substrate from the energy source (e.g., laser power source, optics). Finally, if the visual analysis reveals a non-uniform color, undesirable color spectrum or intensity, and/or fuzziness at the edges of the laser scribe the controller may be configured to vary one or more of the scribing process parameters, for example, laser power to improve the scribing process.

In step 310, the controller instructs the laser scribe module to perform a second laser scribe on the first layer using the modified set of laser scribe parameters based on the analysis performed on the scribe process performed in step 302. If, however, in step 306, the controller determines that the laser scribe process is optimal, the laser scribe parameters do not need to be modified and the method proceeds to step 312 where the controller instructs the laser scribe module to perform a second laser scribe on the first layer using the first set of laser scribe parameters.

In one embodiment, the steps of performing a laser scribe, analyzing the laser scribe to identify relevant morphological parameters, determining whether the laser scribe process is optimal, modifying laser scribe parameters based on the morphological parameters, and performing a subsequent laser scribe using either the original or the modified laser scribe parameters may be performed during the setup of the laser scribe process. For example, the laser scribe module may be configured to carry out a dry run and perform steps 302 through 312 to achieve optimal settings for the laser scribe process before actually starting to produce multiple solar modules.

In other embodiments, steps 304 through 312 may be performed continuously throughout the laser scribe process as the solar modules are fabricated. For example, after step 310, the controller may analyze the second laser scribe to determine whether the morphological parameters extracted from the second laser scribe indicate that modifying the laser scribe parameters has achieved the optimal laser scribe process. If this is not the case, the controller may modify the laser scribe parameters again in an attempt to further fine-tune the laser scribe process. In yet another embodiment, the steps described in FIG. 3 may be performed at some predefined intervals during the laser scribe process.

In one embodiment, the steps described in FIG. 3 may be automated and may be performed without taking the substrate out of the process chamber. With such an approach, no off-line measurements are needed and the solar modules can remain in the production line, shortening the laser scribe cycle time and decreasing the production costs.

Major Axis and Overlap Area Calculations

Figure 4:
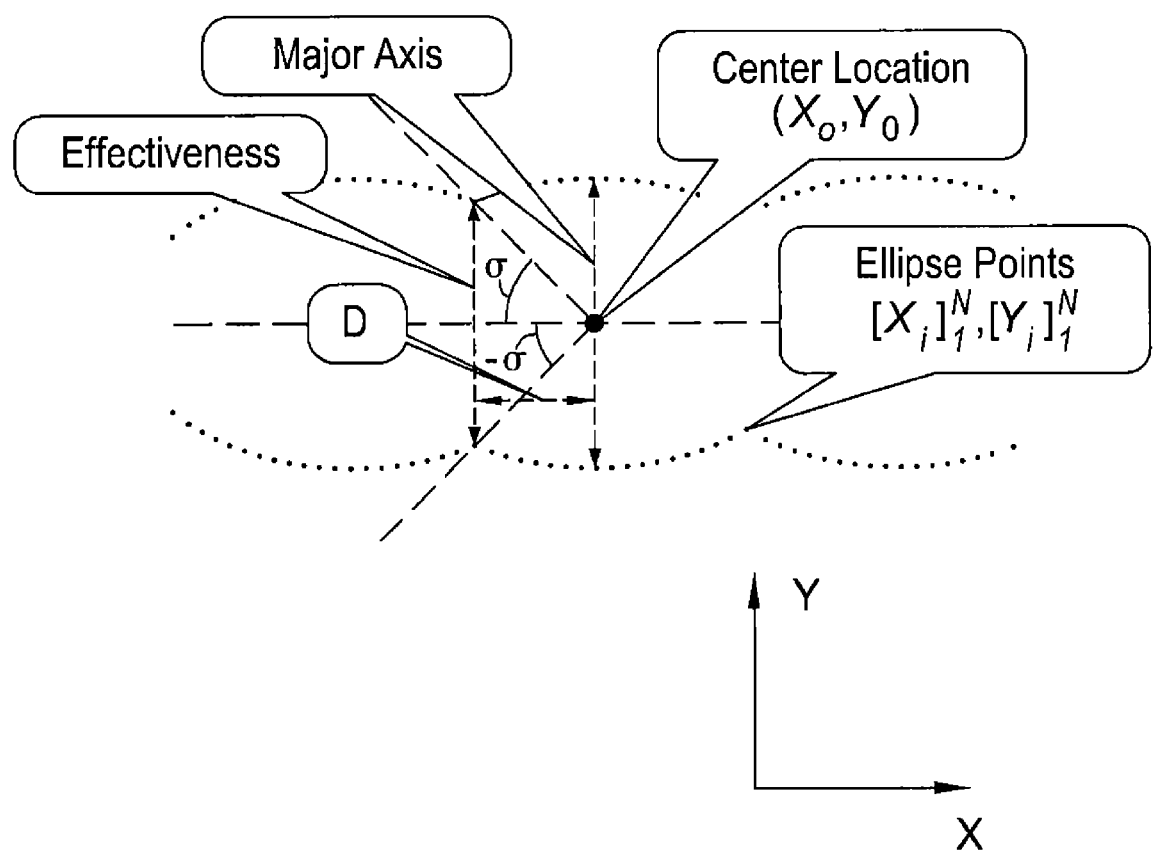
FIG. 4 illustrates parameters available for the calculations of major axis and overlap area, according to one embodiment of the present invention.

Once the edge of the scribed material is detected by the controller, effectiveness, minor axis, and fuzziness may be easily measured and analyzed using the digitized scan of the scribe image to find the local maxima, minima and central points of the scribe. However, further calculations may be required to extract major axis and overlap area. FIG. 4 illustrates parameters available for the calculations of major axis and overlap area, according to one embodiment of the present invention. As shown, parameters available for the calculations include distance D, ellipse points $[X_i]_1^N, [Y_i]_1^N$, and coordinates of the ellipse center $(X_o, Y_o)$ (i.e., the center of a laser spot) all taken from the visual analysis of an image received by the optical inspection device. In one embodiment, the ellipse points $[X_i]_1^N, [Y_i]_1^N$ may be found by the system controller due to a variation in intensity or color in the received image created by the edge(s) of a formed scribe spot. Where, $X_i$ and $Y_i$ are the x and y-coordinates of the edge of the ellipse, and N is the number of coordinates used to define the edge of the ellipse.

An ellipse with a semi-major axis "a" and a semi-minor axis "b" (not shown), centered at the point $(X_o, Y_o)$ and having its major axis parallel to the x-axis may be found for each spot by the equation:

$$\frac{(x-X_0)^2}{a^2} + \frac{(y-Y_0)^2}{b^2} = 1 \tag{1.1}$$

Parametrically, the shape of the measured spot can be expressed as:

$$x = X_0 + a \cos \alpha$$

$$y = X_0 + b \cos \alpha \tag{1.2}$$

where $\alpha$ may be restricted to the interval $-\pi \geq \alpha \leq \pi$.

Equation (1.1) may then be used to extract the major axis, since the rest of the values are known. For more accuracy, several pairs of (x,y) values (e.g., coordinates along the edge of the ellipse) may be used so that the calculated result can be averaged. For N pairs of (x,y), semi-major axis "a" may be calculated as:

$$a = \frac{\sum_{i=1}^{N} \sqrt{\frac{(x_i - X_0)^2}{\left(1 - \frac{(y_i - Y_0)^2}{b^2}\right)}}}{N} = \frac{\sum_{i=1}^{N} \sqrt{\frac{b^2(x_i - X_0)^2}{(b^2 - (y_i - Y_0)^2)}}}{N} \tag{1.3}$$

Then the major axis may be calculated as:

$$\text{MajorAxis} = 2a \tag{1.4}$$

To calculate the overlap area, equation (1.2) may be used to determine the invisible points of the eclipse:

$$x = X_0 + a \cos \alpha$$
$$y = Y_0 + b \cos \alpha, \tag{1.5}$$

where $-\sigma \geq \alpha \leq \sigma$, and $\sigma = \tan^{-1} \frac{\text{Effectiveness}}{2D}$ Numerical integration may then be performed to obtain one side of the overlap area, with angle $\sigma$ defining the integration limits. Similar calculation may then be performed for the other side and results added to obtain the overlap area.

Also, eccentricity "E" may be calculated as follows.

$$E = \sqrt{1 - \frac{\text{MinorAxis}^2}{\text{MajorAxis}^2}} \tag{1.6}$$

One embodiment of the invention may be implemented as a program product for use within a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored, and (ii) writable storage media (e.g., floppy disks within a diskette drive or hard-disk drive or any type of solid-state random-access semiconductor memory) on which alterable information is stored.

One embodiment of the present invention sets forth a method for analyzing visual attributes extracted from a laser scribe image, directly correlating the visual attributes to the laser scribe process parameters, and controlling the laser scribe process based on the measured results. In this manner, a simple and straightforward analysis may be performed to determine the laser scribe process quality and stability and to tune the laser scribe process in-situ (i.e., no off-line measurements). Eliminating the need to perform off-line measurements allows keeping solar modules in the production line, thereby shortening laser scribe cycle time and decreasing production costs. Furthermore, the method allows finding defects in the laser scribes that cannot be measurable by current Quality Assurance methods, for example, resistance measurements techniques cannot see fuzziness, and thus cannot be used to adjust the process parameters needed to resolve this problem.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

While the forgoing is directed to embodiments of the present invention, other and further embodiments of the invention may be devised without departing from the basic scope thereof. For example, aspects of the present invention may be implemented in hardware or software or in a combination of hardware and software. Therefore, the scope of the present invention is determined by the claims that follow.

We claim:
1. A method of scribing a substrate comprising:
   performing a first scribe on a first layer formed on a substrate using a first set of scribe parameters;
   analyzing at least a portion of the first scribe to determine one or more morphological parameters, wherein the one or more morphological parameters is dependent on the first set of scribe parameters, and the one or more morphological parameters is selected from the group consisting of major axis, minor axis, eccentricity, fuzziness, effectiveness, overlap area, and color uniformity;
   based on the one or more determined morphological parameters, modifying the first set of scribe parameters to obtain a second set of scribe parameters; and
   performing a second scribe on the first layer using the second set of scribe parameters.

2. The method of claim 1, wherein the first set and second set of scribe parameters are selected from the group consisting of laser power and scan speed.

3. The method of claim 1, wherein analyzing at least a portion of the first scribe comprises receiving an image of the portion of the first scribe and then performing an analysis of the image to determine the one or more morphological parameters.

4. The method of claim 3, wherein the image is received from a digital imaging device.

5. The method of claim 1, wherein the first set and second set of scribe parameters comprise at least one of a laser frequency, a laser output current, or a scan speed.

6. The method of claim 1, wherein the first set of scribe parameters is selected based on at least one characteristic of the first layer.

7. The method of claim 6, wherein the at least one characteristic of the first layer comprises substrate type, layer thickness, layer doping, layer reflectivity, or stack information.

8. The method of claim 1, wherein the first set of scribe parameters is based on laser beam power distribution.

9. The method of claim 8, wherein performing an analysis includes using an optical inspection device and a controller.

10. The method of claim 9, wherein the optical inspection device is adapted to monitor color variation in the image.

11. The method of claim 1, wherein the steps of performing the first scribe, analyzing at least a portion of the first scribe, modifying the first set of scribe parameters to obtain a second set of scribe parameters, and performing a second scribe are performed without taking the substrate out of a process chamber.

12. The method of claim 1, wherein the steps of performing the first scribe, analyzing at least a portion of the first scribe, modifying the first set of scribe parameters to obtain a second set of scribe parameters, and performing a second scribe are all automated.

13. The method of claim 1, wherein analyzing at least a portion of the first scribe is performed at the beginning of the step of performing the first scribe.

14. The method of claim 1, wherein the steps of performing the first scribe, analyzing at least a portion of the first scribe, modifying the first set of scribe parameters to obtain a second set of scribe parameters, and performing a second scribe are performed a plurality of times during the process of scribing all desired areas of the first layer formed on the substrate.

15. The method of claim 1, further comprising:
   analyzing at least a portion of the second scribe to determine a second set of one or more morphological parameters, wherein the second set of one or more morphological parameters is dependent on the second set of scribe parameters;
   based on the second set of one or more determined morphological parameters, modifying the second set of scribe parameters to obtain a third set of scribe parameters; and
   performing a third scribe on the first layer using the third set of scribe parameters.

16. A method of patterning one or more solar cell devices, comprising:
   placing a first substrate having a first layer disposed thereon into a process chamber;
   forming a first region in the first layer by removing a portion of the first layer using a scribing device, wherein at least one scribing device parameter is used to control the process of removing the portion of the first layer;
   forming an image of at least a portion of the first region;
   analyzing the image using a controller to define one attribute of the portion of the first region, wherein the controller is in communication with the scribing device and an optical inspection device adapted to monitor color variation in the image; and
   adjusting the at least one scribing device parameter using information received from analyzing the image.

17. The method of claim 16, further comprising removing a second region of the first layer on the first substrate, or a third region of a first layer formed on a second substrate, using at least one adjusted scribing device parameter.

18. The method of claim 16, wherein the image is formed using a digital imaging device.

19. A computer-readable storage medium for storing a computer program which, when executed by a processor, performs operations for in-situ tuning of a scribe process performed on a substrate placed in a process chamber and having a first layer disposed thereon, the operations comprising:
   instructing a scribe module to perform a first scribe on the first layer using a first set of scribe parameters;
   analyzing at least a portion of the first scribe to determine one or more morphological parameters, wherein the one or more morphological parameters is dependent on the first set of scribe parameters, and the one or more morphological parameters is selected from the group consisting of major axis, minor axis, eccentricity, fuzziness, effectiveness, overlap area, and color uniformity;

based on the one or more determined morphological parameters, modifying the first set of scribe parameters to obtain a second set of scribe parameters; and instructing the scribe module to perform a second scribe on the first layer using the second set of scribe parameters.

20. The computer-readable storage medium of claim 19, wherein the first and second set of scribe parameters comprise at least one of a laser frequency, a laser output current, or a scan speed.

21. The computer-readable storage medium of claim 19, wherein the first set of scribe parameters is selected based on at least one characteristic of the first layer, and the at least one characteristic of the first layer comprises substrate type, layer thickness, layer doping, layer reflectivity, or stack information.

22. A system for forming a pattern on a solar cell device, comprising:

a scribing device that is adapted to remove material from a first region of a surface of a first substrate;

an optical inspection device positioned to view the first region;

an automation device used to control the position of the first substrate relative to the scribing device; and a controller that is in communication with the scribing device and the optical inspection device, wherein the controller is adapted to adjust the amount of material removed from a second region of the surface of the first substrate, or a second region from a surface of a second substrate, based on an image of the first region received from the optical inspection device adapted to monitor color variation in the image.

23. The system of claim 22, wherein the scribing device is a laser scribe.

24. The system of claim 22, wherein the controller is configured to adjust time or shape distribution of energy delivered to the surface of the first substrate from an energy source.

* * * * *